(12) United States Patent
Ruiz

(10) Patent No.: US 8,745,083 B1
(45) Date of Patent: Jun. 3, 2014

(54) SYSTEM AND METHOD FOR MATCHING CANDIDATES WITH PERSONNEL NEEDS

(71) Applicant: James G. Ruiz, Wexford, PA (US)

(72) Inventor: James G. Ruiz, Wexford, PA (US)

(*) Notice: Subject to any disclaimer, the term of this patent is extended or adjusted under 35 U.S.C. 154(b) by 45 days.

(21) Appl. No.: 13/665,629

(22) Filed: Oct. 31, 2012

Related U.S. Application Data

(60) Provisional application No. 61/553,905, filed on Oct. 31, 2011.

(51) Int. Cl.
*G06F 17/30* (2006.01)
*G06F 17/50* (2006.01)

(52) U.S. Cl.
CPC ...... *G06F 17/5077* (2013.01); *G06F 17/30681* (2013.01); *G06F 17/30867* (2013.01); *G06F 17/3087* (2013.01); *G06F 17/30876* (2013.01); *G06F 17/30997* (2013.01)
USPC ........... 707/770; 707/741; 709/201; 709/203; 709/213; 709/217; 705/321; 705/1.1

(58) Field of Classification Search
CPC .......... G06F 17/5077; G06F 17/30861; G06F 17/30867; G06F 17/3087; G06F 17/30876; G06F 17/30997
USPC .......... 707/741, 770; 709/201, 203, 213, 217; 705/1.1, 321
See application file for complete search history.

(56) References Cited

U.S. PATENT DOCUMENTS

| | | | |
|---|---|---|---|
| 5,758,324 A * | 5/1998 | Hartman et al. | 705/1.1 |
| 6,289,340 B1 | 9/2001 | Puram et al. | |
| 6,385,620 B1 | 5/2002 | Kurzius et al. | |
| 6,401,091 B1 * | 6/2002 | Butler et al. | 1/1 |
| 6,615,405 B1 * | 9/2003 | Goldman et al. | 717/174 |
| 7,051,086 B2 * | 5/2006 | Rhoads et al. | 709/219 |
| 7,212,985 B2 | 5/2007 | Sciuk | |
| 7,424,438 B2 | 9/2008 | Vianello | |
| 7,502,748 B1 | 3/2009 | Baldwin et al. | |
| 7,720,791 B2 | 5/2010 | Hyder et al. | |
| 7,805,382 B2 | 9/2010 | Rosen et al. | |
| 7,827,117 B2 | 11/2010 | MacDaniel et al. | |
| 7,827,125 B1 | 11/2010 | Rennison | |
| 8,001,064 B1 | 8/2011 | Rennison | |
| 8,326,838 B2 * | 12/2012 | Gaitas | 707/741 |
| 8,489,518 B2 * | 7/2013 | Levine et al. | 705/321 |

(Continued)

OTHER PUBLICATIONS

Karl F. Botterbusch, "Selection of Computerized Job Matching Systems," 17 Vocational Evaluation and Work Adjustment Bulletin 121 (1984).

(Continued)

*Primary Examiner* — Frantz Coby
(74) *Attorney, Agent, or Firm* — William F. Lang, IV; Lang Patent Law LLC

(57) ABSTRACT

A system and method for matching candidates with personnel needs is provided. The system accepts both candidate attributes and personnel need attributes. At least one algorithm is utilized to match candidates with personnel needs. Feedback is solicited from both candidates and personnel searchers at various stages throughout a matching process. Based on this feedback, the system may modify at least one algorithm, and/or, in a system that utilizes a plurality of algorithms, modify at least one weight given to the results of at least one of the algorithms. The candidate attributes and personnel need attributes are also modified based on the feedback. Revised candidate lists and/or personnel need lists are provided based on the revised algorithms.

23 Claims, 12 Drawing Sheets

(56) References Cited

U.S. PATENT DOCUMENTS

| | | | |
|---|---|---|---|
| 2002/0128894 A1 | 9/2002 | Farenden | |
| 2002/0133369 A1 | 9/2002 | Johnson | |
| 2002/0169631 A1* | 11/2002 | Lewis | 705/1 |
| 2003/0093322 A1 | 5/2003 | Sciuk | |
| 2003/0200136 A1 | 10/2003 | Dewar | |
| 2004/0260731 A1* | 12/2004 | Pickford et al. | 707/104.1 |
| 2005/0055231 A1* | 3/2005 | Lee | 705/1 |
| 2006/0178896 A1 | 8/2006 | Sproul | |
| 2006/0212338 A1 | 9/2006 | Bogle et al. | |
| 2006/0229896 A1 | 10/2006 | Rosen et al. | |
| 2007/0038636 A1* | 2/2007 | Zanghi et al. | 707/10 |
| 2008/0288271 A1 | 11/2008 | Faust | |
| 2009/0049095 A1* | 2/2009 | Simon et al. | 707/104.1 |
| 2009/0063565 A1* | 3/2009 | Abhyanker | 707/104.1 |
| 2009/0070133 A1 | 3/2009 | Bonilla et al. | |
| 2009/0094090 A1* | 4/2009 | Dow | 705/9 |
| 2009/0138450 A1* | 5/2009 | Richardson | 707/3 |
| 2009/0164311 A1* | 6/2009 | Deyo | 705/11 |
| 2009/0319289 A1 | 12/2009 | Pande | |
| 2010/0211601 A1* | 8/2010 | Gaitas | 707/770 |
| 2010/0293126 A1 | 11/2010 | Lang et al. | |
| 2011/0022530 A1 | 1/2011 | Bogle et al. | |
| 2011/0106550 A1* | 5/2011 | Skelton | 705/1.1 |
| 2011/0112977 A1* | 5/2011 | Baumgarten et al. | 705/321 |
| 2011/0178941 A1* | 7/2011 | Balardo et al. | 705/321 |

OTHER PUBLICATIONS

"K-Nearest Neighbor Algorithm", Wikipedia, K-nearest_neighbor_algorithm, (2009).

Ronald E. Walpole and Raymond H. Myers, Probability and Statistics for Engineers and Scientists 366-69, 391-93 (1989).

* cited by examiner

SYSTEM AND METHOD FOR MATCHING CANDIDATES WITH PERSONNEL NEEDS

CROSS-REFERENCE TO RELATED APPLICATION

This application claims the benefit of U.S. provisional patent application No. 61/553,905, filed on Oct. 31, 2011, and entitled "System and Method for Matching Candidates with Personnel Needs."

TECHNICAL FIELD

The present invention provides a computer implemented system and method for matching personnel candidates with personnel needs, for example, jobs. More specifically, the invention provides a system and method for soliciting feedback on a list of personnel candidates or personnel needs, and modifying at least one algorithm for matching candidates with needs, and/or the profiles of the candidate and/or personnel need, in response to feedback regarding the quality of the matches.

BACKGROUND INFORMATION

Numerous computer implemented methods for matching candidates with personnel needs, for example, matching jobs with job candidates or matching dating prospects, presently exist. However, all such systems have shortcomings that are addressed by the present invention.

U.S. Pat. No. 7,502,748, issued to B. Baldwin et al. on Mar. 10, 2009, discloses a job matching system. The system includes a database that includes information about available jobs and available candidates. The information is in the form of a plurality of attributes, with each attribute being assigned a value. Information about job attributes is entered by employers, who may derive the information utilizing questionnaires and performance evaluations for current employees. Information about candidates is derived from a personality assessment system. Candidates are evaluated for specific positions by calculating differences between job attribute values and candidate attribute values, then calculating the sum of the absolute value of these differences. A lower result indicates a better match. Some attributes may be designated as critical, and candidates not having attribute values matching the specified range for these critical attributes will not be considered. The resulting job list is supplied to individual candidates, who then select the particular jobs to which candidate would like to apply. Employers can be notified that the candidate has used the service, and of the degree of match found by the service, thereby assuring employers that their personality is suited for the available job. Employers are not provided with information about suitable candidates who do not initiate contact with the employer. This system relies on only a single algorithm, and provides no way of modifying the algorithm, or tailoring the algorithm to the preferences of a particular user.

U.S. Pat. No. 8,001,064, issued to E. Rennison on Aug. 16, 2011, discloses a search system that permits searchers to rate each of the search results on a scale of 1 to 5. Future search results are customized for that individual searcher based on the ratings given to the results of previous searches. Inter category and intra category concept relationships are determined to provide similar results that may be of interest to the searcher, with examples of locations or job titles given. This system is therefore based simply on the degree to which the searcher likes or dislikes a particular result, without any input about why the user likes or dislikes a particular result, or which characteristics within future search results would make these future results more desirable.

US 2003/0200136, filed by K. L. Dewar and published on Oct. 23, 2003, discloses a system of human resources management. Job candidates are asked a series of questions during the application or interview process. Candidates are ranked based on their answers the questions. The ranking is based initially on answers to "knock out" questions. Next, points are added for answers matching those of previous candidates with successful performance evaluations. Similarly, points are deducted for answers matching those of previous candidates with unsuccessful performance evaluations. The added or subtracted points are multiplied by a weighing factor assigned to each question. Lastly, the points are added together to determine the ranking. After a successful candidate is employed, employee evaluations are cross checked with the application and interview questions to identify questions and answers which are highly likely to indicate a candidate's probability of success, so that these questions can be weighted more heavily in future interviews. Similarly, evaluations are cross checked with application and interview questions to identify questions which are less likely to predict success, so that these questions can be weighted less heavily, or perhaps eliminated. The ranking system is therefore limited to a comparison of interview questions and answers with those of other candidates, and fails to take into account numerous other potential predictors of success or failure in ranking candidates.

U.S. Pat. No. 7,827,117 discloses a system of matching jobs with job candidates, wherein candidates and jobs are assigned points based on the number and timing of views of information therein. Employers are then charged a premium for viewing the contact information of candidates with higher numbers of points. This system therefore measures the popularity of candidates within the search results, rather than the actual likelihood of success of these candidates.

Accordingly, there is a need for a system for matching candidates with personnel needs that utilizes one or more flexible algorithms to match candidates with personnel needs. These algorithms should ideally take into account a variety of personnel searcher, personnel need, and candidate attributes, collecting this information utilizing a variety of methods. There is a further need for a system that solicits feedback from both candidates and personnel searchers at various stages within the matching process, and utilizes this feedback to improve future search results through either modification of individual algorithms, through modification of the weight given to the results of each of multiple algorithms, and/or through modification of the candidate and personnel need profiles, resulting in customized algorithms and/or profiles that can be utilized for future searches.

SUMMARY

The above needs are met by a system for matching personnel needs with candidates. The system includes a personnel need database that is structured to include at least one attribute of each personnel needed. The system further includes a candidate database that is structured to include at least one attribute of each candidate. At least one matching algorithm is utilized to match candidates with personnel needs based on a comparison of the attributes. Feedback is solicited regarding the quality of the matches. Based on this feedback, the matching algorithm and/or the candidate and personnel need profiles are modified, and a new list of matches is generated.

These and other aspects of the invention will become apparent through the following description and drawings.

BRIEF DESCRIPTION OF THE DRAWINGS

Like reference characters denote like elements throughout the drawings.

DETAILED DESCRIPTION

Figure 1:
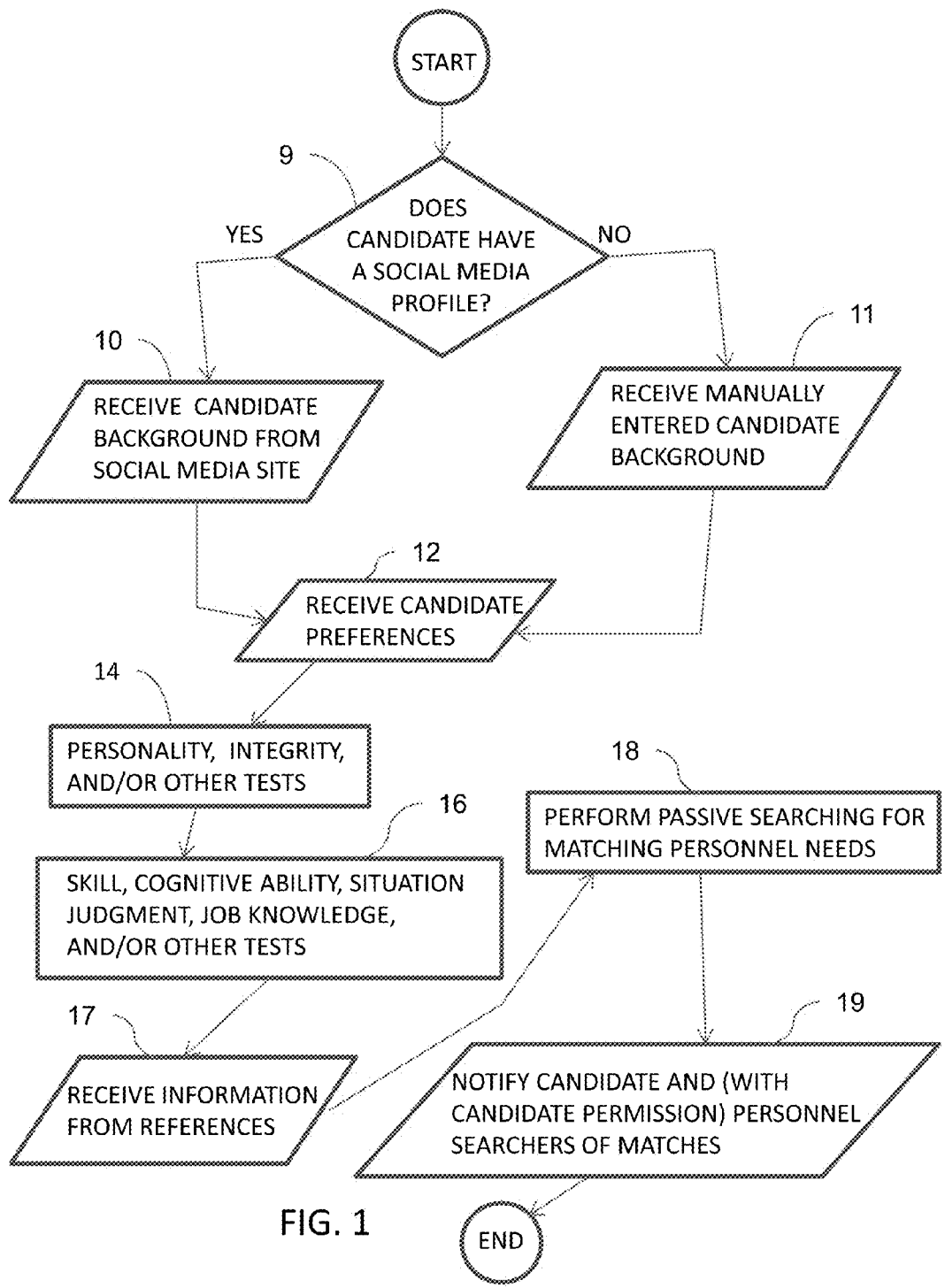
FIG. 1 is a flowchart showing the process of forming an initial profile for a candidate.

Referring to the drawings, a system of matching candidates with personnel searchers having personnel needs is illustrated. Although the illustrated example is directed primarily towards matching employment candidates with jobs, the terms candidates (those seeking to fulfill a personnel need), personnel needs, and personnel searchers (those having a personnel need) are intended to include any application wherein people or entities are searching for people to fulfill a need. Other examples could include searches for independent contractors to perform specific assignments, or matchmaking services.

Initially, information about both candidates and personnel needs must be entered into the system. The goal at this stage is not merely to enter a description of a candidate or a personnel need, but to provide sufficient information about each so that accurate matching can be performed. In the case of an employment candidate, a simple resume will obviously be tailored to make a candidate appear as favorable as possible. Furthermore, the resume is only a partial indicator of the traits required by employer, such as talent, dependability, etc. Additionally, because the goal is to match candidates with personnel needs in a manner that will result in maximum satisfaction for both the candidate and the personnel need, information about the personality and preferences of the candidate are important. Therefore, the candidate profile entry process depicted in FIG. 1 acquires a wide range of information from multiple sources.

Beginning at step 9, the candidate is asked whether they utilize a social media site that contains their information. If so, the candidate's background information is retrieved from the specified site at step 10. Otherwise, the candidate's background information is manually entered at step 11. This information includes the candidate education, employment history, significant accomplishments, and similar information. U.S. Pat. No. 6,289,340 the entire disclosure of which is expressly incorporated herein by reference, discloses a system of cross validating a candidate's skill level with their work experience which may be used in some examples of the present invention. Next, a candidate's preferences, such as geographic location, work environments, work likes and dislikes, etc. are entered at step 12. A personality test, integrity test, and/or other testing may be performed at step 14 to determine the candidate's personality profile, as well as other candidate characteristics. A different test or set of tests may be utilized depending on the nature of the personnel need sought. U.S. Pat. No. 7,502,748, the entire disclosure of which is expressly incorporated herein by reference, describes one example of such a personality test that may optionally be used. A skill test, cognitive ability test, situation judgment test, job knowledge test, and/or other testing may be performed at step 16 to verify the skills claimed by the candidate. For example, a mechanical engineering candidate may be asked questions about thermodynamics, or a candidate claiming foreign language skills may be asked a question in the language at issue. Lastly, information may be acquired from references named by the candidate at step 17. In some examples, individuals willing to act as references may be sent a questionnaire, with the answers becoming a part of the candidates profile. US 2011/0022530, the entire disclosure of which is expressly incorporated herein by reference, discloses one possible system for utilizing information from a candidate's references that may optionally be utilized by some examples of the present invention.

Once entered, a candidate's profile will be dynamic and customizable based on information from a wide variety of direct and indirect sources. For example, personnel needs for which the candidate applies will reveal information about the preferences of the candidate, and can be used to customize the candidate's profile. Numerous different actions taken by the candidate, or with respect to the candidate, may reveal information about the candidate's attributes that can be included in the candidate's profile.

Figure 2:
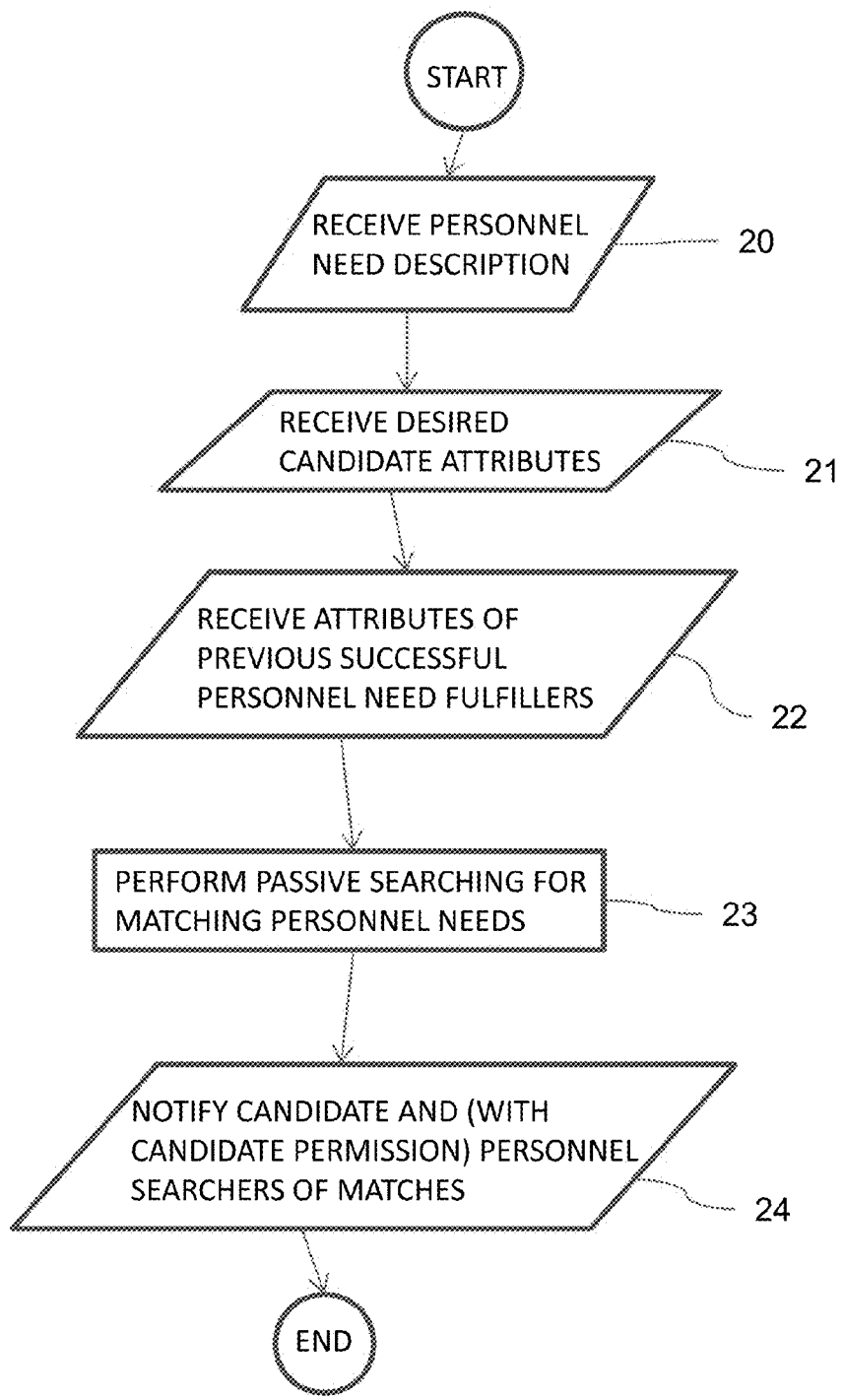
FIG. 2 is a flowchart showing the process of forming an initial profile for a personnel need.

An example procedure for entering personnel need information is illustrated in FIG. 2. A description of the need to be filled is entered at step 20, and a set of desired candidate attributes is entered at step 21. These steps are preferably performed by receiving information from multiple individuals associated with the employer in the case of an employee search. Examples of information to be entered during these steps may include not only the skills required, but also the personnel need characteristics, employer characteristics, and potentially other information as well. Templates and preselected questions may be utilized to assist in entering this information. Next, the attributes of individuals who have previously successfully fulfilled the personnel need may be entered at step 22. In some examples, the information stored in the database will be a detailed description of the need to be fulfilled and the likely characteristics of a successful candidate, stored in terms of attributes that match the attributes determined when candidates enter their profiles into the system, so that matching sets of attributes may be compared by the search and ranking algorithms.

As candidates and personnel needs are entered into the system, both active and passive searching may be conducted. Passive searching occurs upon the entry of any candidate or personnel need information into the system, at which point the system will automatically perform searches for matching candidates or personnel needs, as shown at steps 18 (FIG. 1) and 23 (FIG. 2). A candidate who is not conducting an active search, but may be interested in personnel needs that may be added to the system, may therefore effectively utilize the system. Candidates will be notified any time a personnel need for which they would be a good fit is added to the system at step 19. Similarly, personnel searchers will be notified any time candidates that are a good fit for their personnel needs are added to the system, subject to the consent of the candidate to reveal their information to that personnel searcher, at step 24. The candidate or personnel searcher may then provide feedback and seek modified active search results as described below, or may select a match for further screening as described below.

Figure 3A:
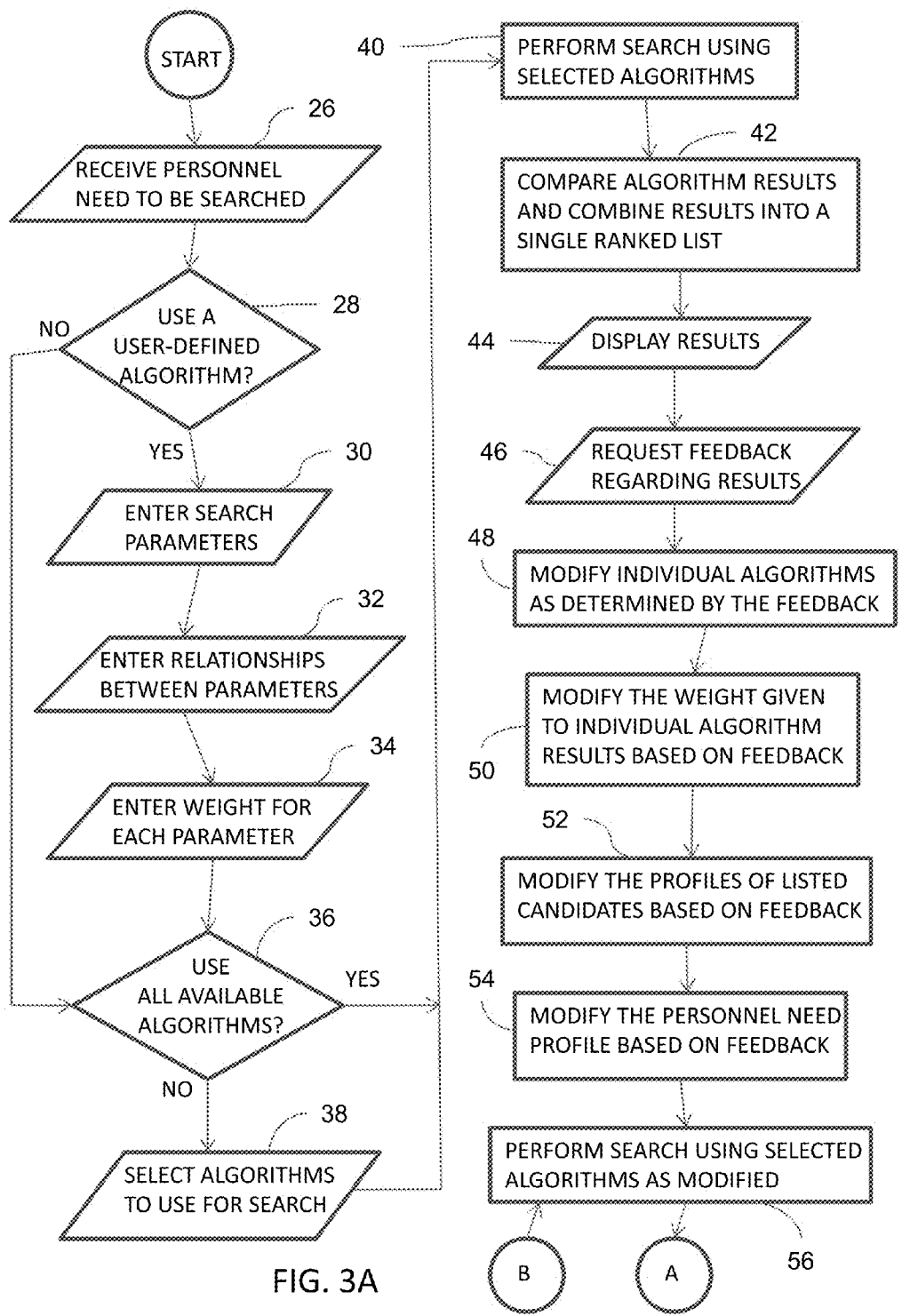
FIGS. 3A-3B depict a flowchart showing the process of searching, profile modification, and algorithm modification as seen by a personnel searcher.
Figure 3B:
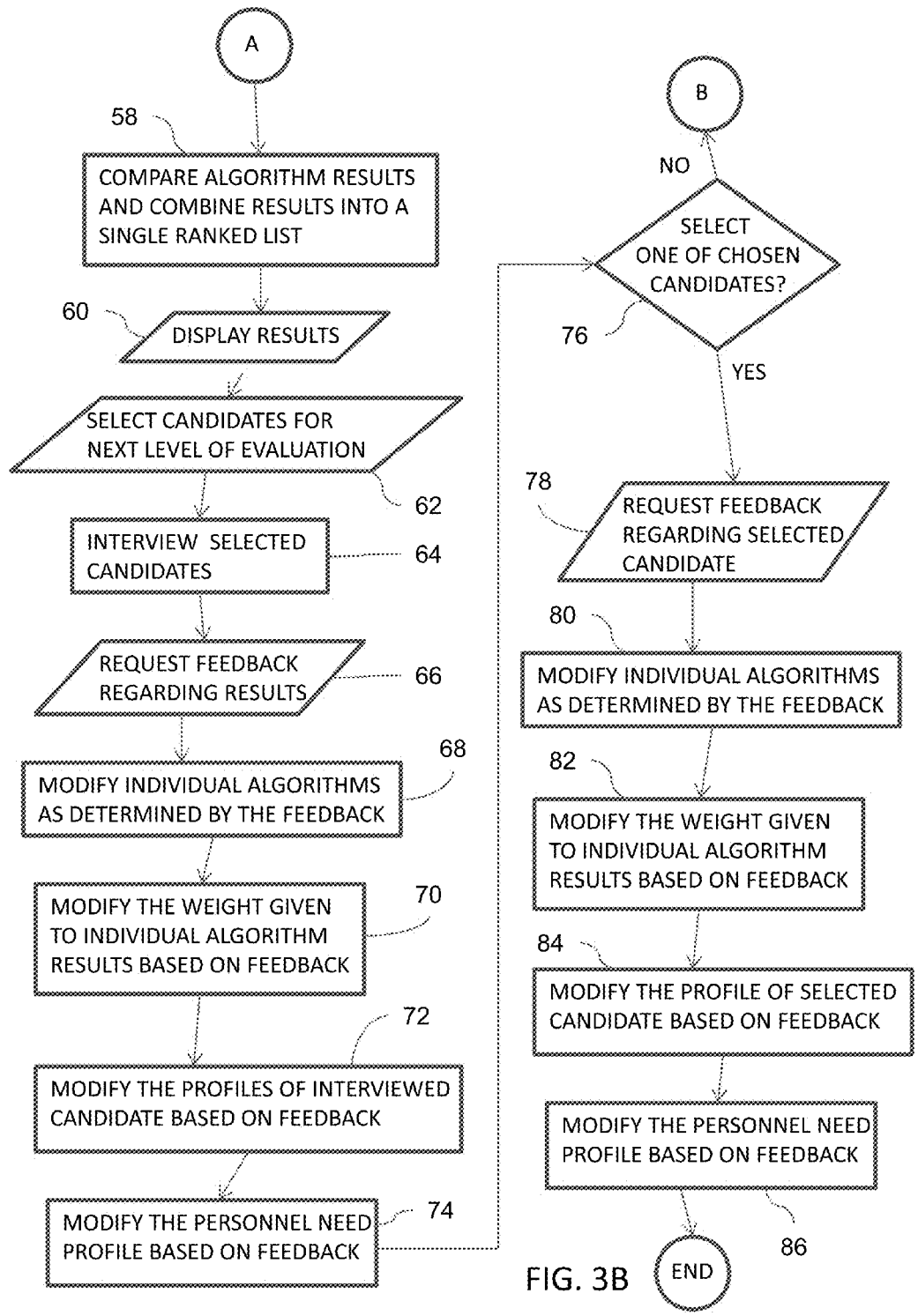

The process of conducting an active search from the standpoint of a personnel searcher, such as an employer or recruiter, is depicted in FIGS. 3A-3B. The process begins by designating a personnel need to be searched at step 26. This personnel need may be one which was recently entered utilizing the process of FIG. 2, or a personnel need which already exists in the system, and which has a description that has possibly been refined through previous searches for candidates to fill this position, as described below. As explained in greater detail below, searching is performed utilizing at least one computer implemented algorithm for comparing the attributes of the personnel need with the attributes of candidates whose information is stored within the system. In some examples, multiple algorithms may be utilized to perform this search, with the results of the various algorithms being compared to produce a single list of candidates based on the fit between the attributes of the candidate and the attributes of the personnel need. The list will preferably rank the candidates based on the strength of the fit. In some examples, one of the algorithms used may be an algorithm defined by a personnel searcher, as described in greater detail below. The candidate database to be searched may in some examples include all candidates who have entered their information into the system. In other examples, candidate information may be made available to personnel searchers only after a candidate has indicated that they wish for their information to be made available to a particular personnel searcher. This could be accomplished by either entering a candidate into a personnel searcher's database after a candidate performs a search and submits an application to that personnel searcher, or by prompting a candidate if that candidate is matched to a particular personnel need during a passive search or an active search performed by a personnel searcher.

Once a personnel need has been identified, the specific algorithms to be utilized must be identified. Toward this end, the personnel searcher is prompted at step 28 to indicate whether they wish to define their own algorithm to be utilized in the search process. If the personnel searcher wishes to define their own algorithm, then they are prompted to enter a set of search parameters at step 30, to enter relationships between the search parameters at step 32, and to enter a weight for each parameter at step 34. As one example, the search parameters could be specific characteristics that are either possessed, or not possessed, by various candidates. In this instance, the relationships between the search parameters may be in the form of Boolean connectors. As another example, the search parameters could be attributes that a candidate possesses to a quantified degree, with the degree to which the attribute is possessed being assigned a numerical value within the database. In this instance, the relationships between the parameters could be mathematical operations. In either case, the weight assigned to specific search parameters ensures that parameters which are more important to the personnel searcher can be given a higher weight in the algorithm defined by the personnel searcher. Depending on the manner in which information is stored within the database, various templates may be provided by the system to assist the personnel searcher in defining their desired algorithm.

Next, a decision is made at step 36 to use either all available algorithms, or to select specific algorithms for use at step 38. Some personnel searchers may find that different algorithms are more effective at producing quality matches for different personnel needs, and are given the ability to customize their search using these algorithms. Algorithms that may be included in the possible combination of algorithms are disclosed in U.S. Pat. No. 7,502,748, U.S. Pat. No. 7,805,382, U.S. Pat. No. 7,827,117, US 2006/0229896, US 2006/0178896, and US 2011/0022530, the entire disclosure of which are expressly incorporated herein by reference. The specific combination of algorithms selected at step 28 through 38 is then utilized to perform a search of the candidate database at step 40. The use of multiple algorithms to search for candidates is expected to produce a wider diversity of candidates within the list than would be expected from a single algorithm, so that a greater number of candidates can be evaluated at the initial search/initial screening stage. The results produced by the selected algorithms are then compared and combined at step 42 to produce a single list of search results, which are then displayed at step 44, with candidates ranked according to the strength of the fit. One possible method of ranking candidates is disclosed in US 2003/0200136, the disclosure of which is expressly incorporated by reference herein. At this point, the searcher is requested to provide feedback regarding the extent to which the search results meet the searcher's needs at step 46. The feedback provided could potentially take numerous forms, with the simplest being a simple indication of the degree to which specific candidates are liked or disliked. Alternatively, the feedback could include more specific information about the searcher's perception of the extent to which the listed candidates meet certain attribute requirements of the personnel need. Regardless of whether high order feedback or attribute-specific feedback is utilized, the feedback is analyzed for patterns from which additional information about the user's preferences can be derived. Using this feedback, the algorithms utilized to produce the search result may be modified at step 48, and/or the weight given to individual algorithms in combining the results at step 42 may be modified at step 50. Calibration of the algorithms may also be performed using location mapping. Additionally, the profiles of the candidate for which feedback is given, as well as the personnel need which was searched, may be modified at steps 52, 54, respectively. Some methods of utilizing feedback to modify search results are disclosed in U.S. Pat. No. 8,001, 064, U.S. Pat. No. 7,720,791, and US 2009/0070133, the disclosures of which are expressly incorporated by reference herein. Additional approaches that could be used include utilizing a "closest neighbor" approach for selected candidates. Candidates that have already been reviewed will be filtered out of future search results.

A new search is performed, utilizing the modified algorithms and profiles, at step 56. These results are again compared and utilized to form a single list of results at step 58. The results are displayed at step 60, so that candidates may be selected for the next level of evaluation at step 62. In the illustrated example, the next level of evaluation is an interview of selected candidates at step 64. In other examples, the next level of evaluation could potentially be a telephone pre-screening of selected candidates. Feedback is again requested from the searcher at step 66. Individual algorithms are modified as determined by this feedback at step 68, and the weight given to the results of individual algorithms is modified at step 70. The profiles of the interview candidates is modified at step 72, and the personnel need profile is modified at step 74, also based on this feedback.

In the event that none of the interviewed candidates is ultimately selected to fulfill the personnel meeting at step 76, the process returns to step 56 so that a new search can be performed. Alternatively, if one of the interview candidates is selected to fulfill the personnel need at step 76, feedback will again be requested from the searcher at step 78. Based on this feedback, the individual algorithms utilized to select the candidate are modified at step 80, the weights given to the results of these algorithms in future searches is modified at step 82, the profile of the selected candidate is modified at step 84, and the description of the personnel need within the database is modified at step 86 so that the modified profiles will be available when future searches are performed.

Figure 4A:
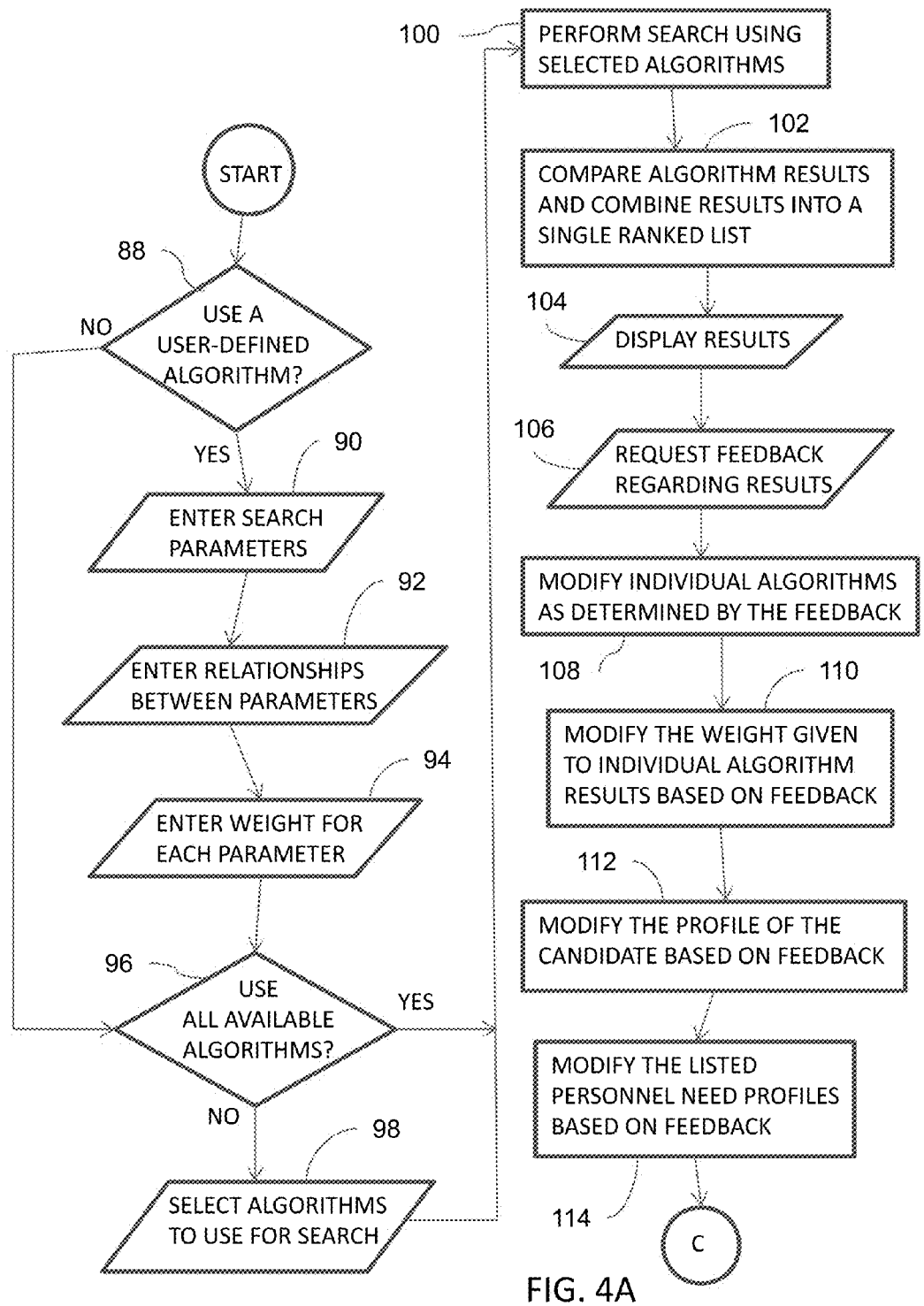
FIGS. 4A-4C depict a flowchart showing the process of searching, profile modification, and algorithm modification as seen by a candidate.
Figure 4B:
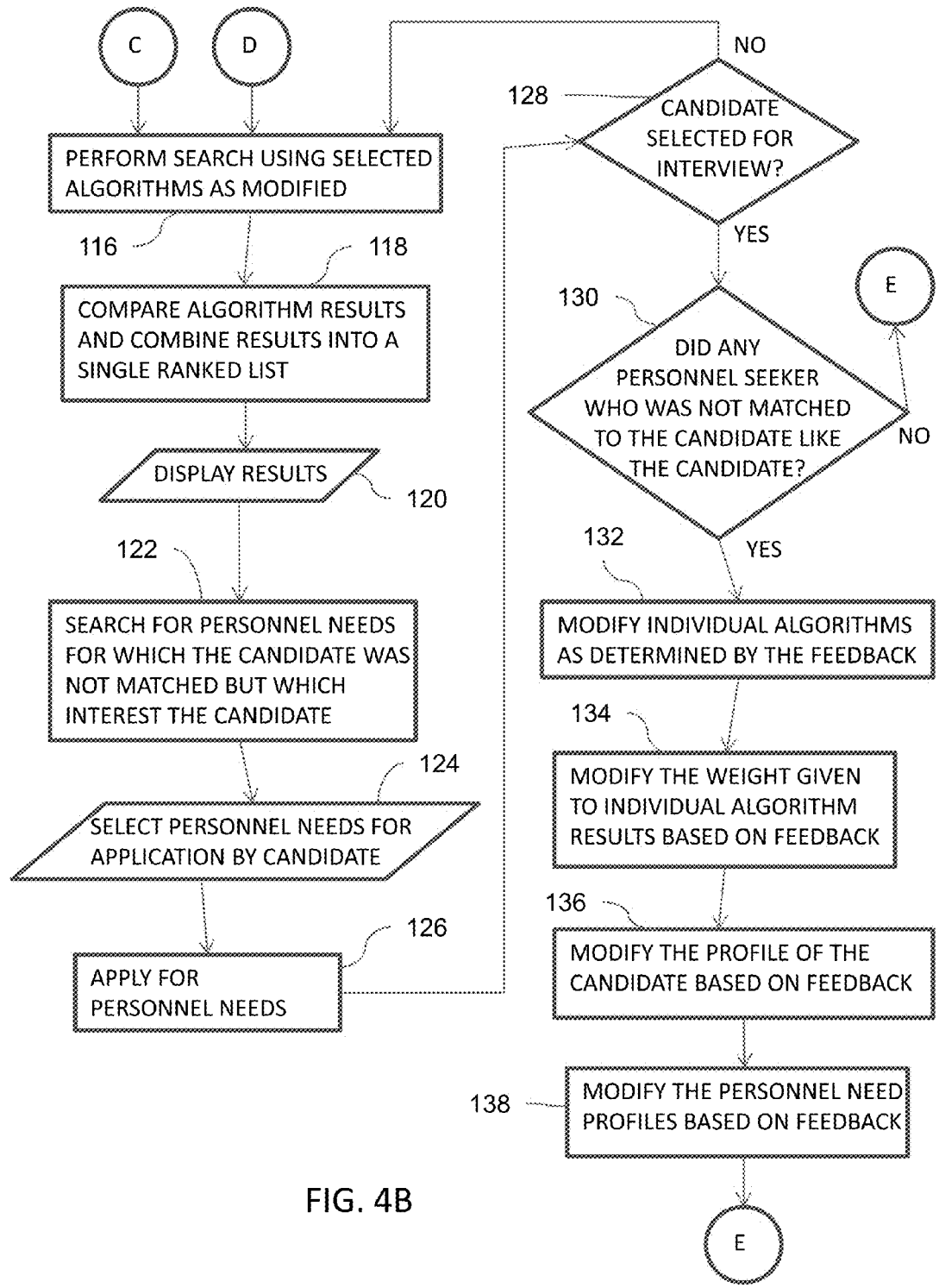
Figure 4C:
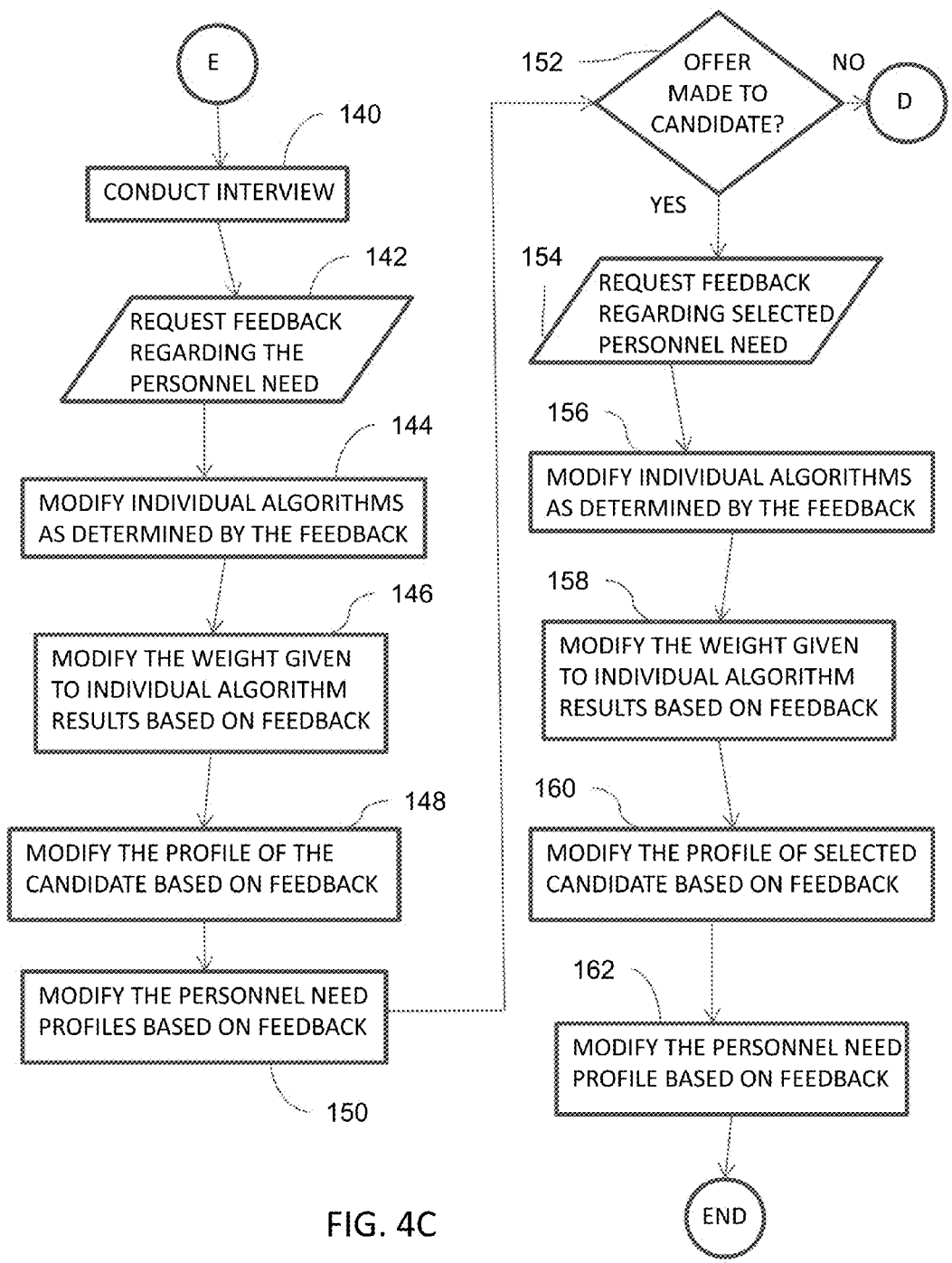

The search process as seen by the candidate is depicted in FIGS. 4A-4C. The candidate, who has already entered his information utilizing the procedure of FIG. 1, begins by determining the algorithm or combination of algorithms to be utilized in performing his or her search. The candidate may choose to utilize his own algorithm at step 88. If the candidate chooses to utilize his own algorithm, the candidate may enter the desired search parameters at step 90, the interrelationships between the selected search parameters at step 92, and the weight given to the individual parameters at step 94. As one example, the search parameters could be specific characteristics that are either possessed, or not possessed, by various personnel needs. In this instance, the relationships between the search parameters may be in the form of Boolean connectors. As another example, the search parameters could the attributes that a personnel need possesses to a quantified degree, with the degree to which the attribute is possessed being assigned a numerical value within the database. In this instance, the relationships between the parameters could be mathematical operations. In either case, the weight assigned to specific search parameters ensures that parameters which are more important to the personnel searcher can be given a higher weight in the algorithm defined by the personnel searcher. Depending on the manner in which information is stored within the database, various templates may be provided by the system to assist the personnel searcher in defining their desired algorithm.

Next, the candidate may decide whether to simply use all available algorithms to perform the search, or to select specific algorithms, at step 96. If the user chooses to utilize specific algorithms, these may be selected at step 98. A search is performed utilizing the selected algorithms at step 100. The results produced by the selected algorithms are then compared and combined at step 102, and the results displayed at step 104, ranked according to the strength of the fit. At this point, the candidate is requested to provide feedback regarding the extent to which the search results meet the candidate's needs at step 106. The feedback provided could potentially take numerous forms, with the simplest being a simple indication of the degree to which specific personnel needs are liked or disliked. Alternatively, the feedback could include more specific information about the candidate's perception of the extent to which the listed personnel needs meet certain attribute requirements of the candidate. Using this feedback, the algorithms utilized to produce the search result may be modified at step 108, and/or the weight given to individual algorithms in combining the results at step 102 may be modified at step 110. Additionally, the profiles of the candidate performing the search, as well as the listed personnel needs, may be modified at steps 102, 104, respectively.

Using the modified profiles and search algorithms, a new search is performed at step 116. The results of the algorithms used are compared and combined at step 118 in the results displayed at step 120. The candidate is then given an opportunity to utilize other, more conventional search methods which are well known to those skilled in the art to search for other personnel needs within the database to which the candidate was not matched at step 122. Once the candidate has finished searching, the candidate may select the personnel needs for which the candidate wishes to apply at step 124, and to apply for these personnel needs at step 126. The personnel searcher's may then review the candidate's application, or utilize the candidate's application in the procedure set forth in FIGS. 3A-3B to determine whether the candidate should pass to the next level of evaluation. The determination of whether to interview a candidate is made at step 128. In the event that a personnel searcher to which the candidate was not matched decides that the candidate merits further review at step 130, then the individual algorithms utilized by the candidate, as well as the weight given to the search results generated by these algorithms, are modified at steps 132, 134, respectively. Additionally, the profiles of the candidate and the personnel need are modified at steps 136, 138, respectively.

Additional screening, which in the illustrated example is an interview, is conducted at step 140. Feedback is requested from the candidate regarding the interview at step 142. Based on this feedback, the algorithms utilized to match the candidate to the personnel need, as well as the weight given to the result of those algorithms, are modified in steps 144, 146, respectively. Additionally, the candidate's profile, as well as the profile of the personnel needs for which the candidate interviewed, are modified at steps 148, 150, respectively.

If the candidate is not ultimately selected for the personnel need at step 152, then another search utilizing the modified algorithms may be performed at step 116. If the candidate is selected, then about six months after the candidate begins fulfilling the personnel need, feedback is requested from the candidate at step 154. Based on this feedback, the algorithms utilized to match the candidate with the personnel need, as well as the weight given to these algorithms, are modified at steps 156, 158, respectively. The candidate's profile, as well as the profile of the personnel need, are modified at steps 160, 162, respectively. The modified profiles are then available for future searches.

Figure 5:
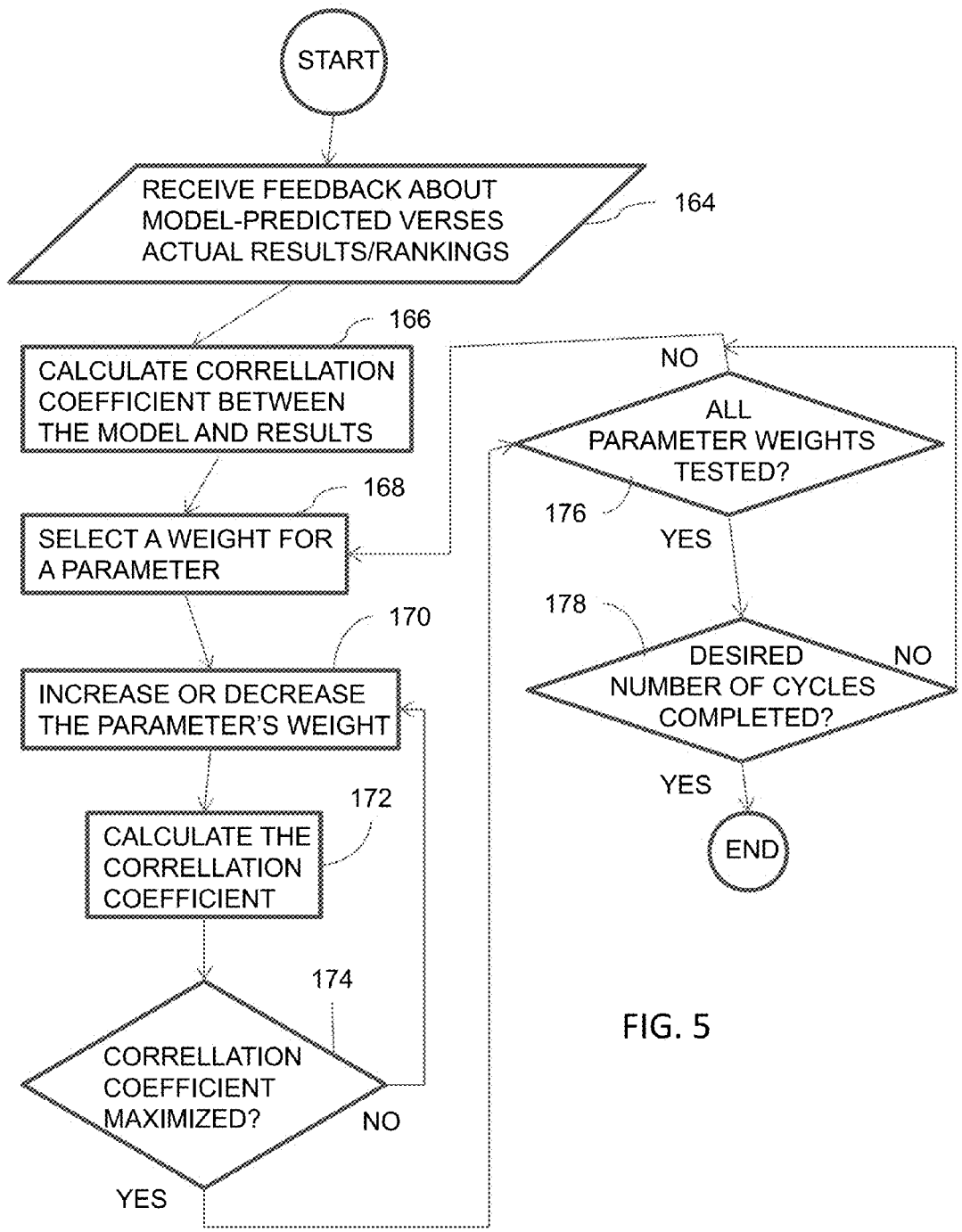
FIG. 5 depicts a flowchart showing the process of modifying an algorithm by maximizing the algorithms correlation coefficient.

Referring to FIG. 5, one possible system for improving an algorithm based on the quality of the search results is illustrated. This system is based on calculating a correlation coefficient for the algorithm, and then making sequential modifications to the algorithm in an attempt to maximize the correlation coefficient. The correlation coefficient is defined by the equation $$r = \frac{\sum_{i=1}^{n}(x_i - \bar{x})(y_i - \bar{y})}{\sqrt{\left(\sum_{i=1}^{n}(x_i - \bar{x})^2\right)\left(\sum_{i=1}^{n}(y_i - \bar{y})^2\right)}}$$

where r=the correlation coefficient, $x_i$=individual characteristic values, $y_i$=individual result values, $\bar{z}$=the fitted individual characteristic value, $\bar{y}$=the fitted result values, and n=the number of characteristics. A correlation coefficient will typically have a value between 0 and 1, with a higher value indicating a better correlation between characteristics and results. Initially, both characteristics and results would need to be reduced to numerical values, which would be necessary anyway for at least some algorithms. Feedback about the quality of the results is received at step 164. This feedback is then utilized to determine deviations between desired results and actual results. A correlation coefficient between the model and results is calculated at step 166.

Once an initial correlation coefficient is calculated, an attempt to maximize this correlation coefficient can be made. The illustrated example assumes an algorithm having a plurality of characteristics, each of which is multiplied by a weight depending on its relative importance. At step 168, the first weight is selected. This weight is then increased or decreased at step 170, and a new correlation coefficient is calculated at step 172. The effect of this change on the correlation coefficient is checked at step 174. If the correlation coefficient has not been maximized, then regardless of whether the correlation coefficient has increased or decreased, the process returns to step 174 further modification of that particular weight. If the correlation coefficient has increased, then the weight will likely be modified in the same direction in an attempt to produce a further increase. Similarly, if the correlation coefficient has decreased, then the weight would likely be modified in the opposite direction in an attempt to achieve improved results. Once a maximum correlation coefficient is reached for variation of the first variable, the system will check at step 176 to determine if additional weights for additional characteristics have been checked. If not, the system will move to the next characteristic at step 168, again varying the weight at 170.

Once all weights for all parameters have been modified at least once, the system will check at step 178 to see if the desired number of cycles has been completed. Obviously modification of subsequent weights could affect the maximum value of a previously modified weight. Therefore, completing the cycle a plurality of times insurers that the correlation coefficient is in fact maximized.

Figure 6:
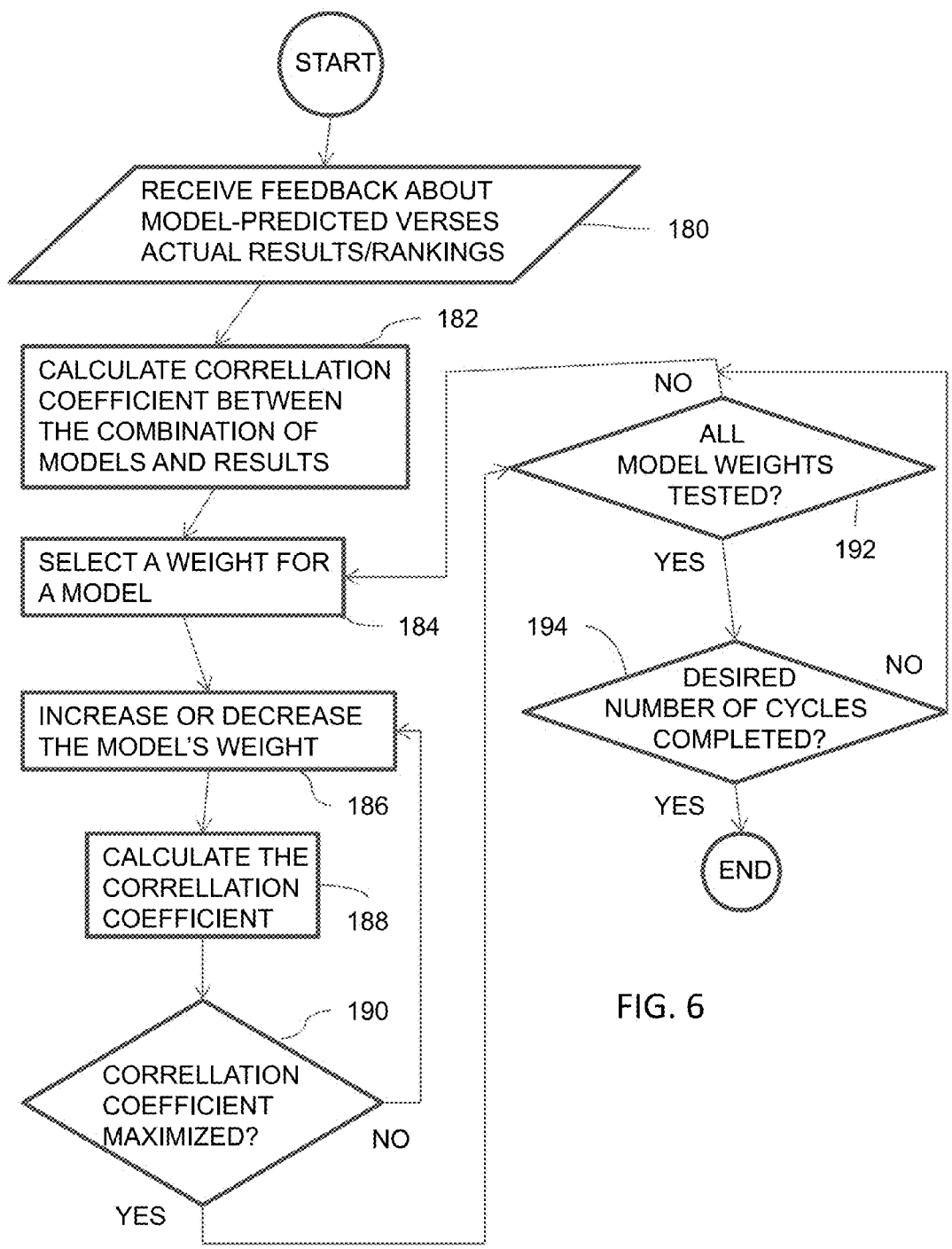
FIG. 6 depicts a flowchart showing the process of modifying the weight given to each of a group of algorithms by maximizing the correlation coefficient of the overall algorithm.

Referring to FIG. 6, a similar method of varying the weight given to results produced by different algorithms is illustrated. As before, both characteristics and results would need to be reduced to numerical values, which would be necessary anyway for at least some algorithms. Feedback about the quality of the results is received at step 180. This feedback is then utilized to determine deviations between desired results and actual results. A correlation coefficient between the model and results is calculated at step 182.

Once an initial correlation coefficient is calculated, an attempt to maximize this correlation coefficient can be made. The illustrated example assumes an algorithm having a plurality of characteristics, each of which is multiplied by a weight depending on its relative importance. At step 184, the first weight is selected. This weight is then increased or decreased at step 186, and a new correlation coefficient is calculated at step 188. The effect of this change on the correlation coefficient is checked at step 190. If the correlation coefficient has not been maximized, then regardless of whether the correlation coefficient has increased or decreased, the process returns to step 188 further modification of that particular weight. If the correlation coefficient has increased, then the weight will likely be modified in the same direction in an attempt to produce a further increase. Similarly, if the correlation coefficient has decreased, then the weight would likely be modified in the opposite direction in an attempt to achieve improved results. Once a maximum correlation coefficient is reached for variation of the first variable, the system will check at step 192 to determine if additional weights for additional characteristics have been checked. If not, the system will move to the next characteristic at step 184, again varying the weight at 186.

Once all weights for all parameters have been modified at least once, the system will check at step 194 to see if the desired number of cycles has been completed. Obviously modification of subsequent weights could affect the maximum value of a previously modified weight. Therefore, completing the cycle a plurality of times insurers that the correlation coefficient is in fact maximized.

Figure 7:
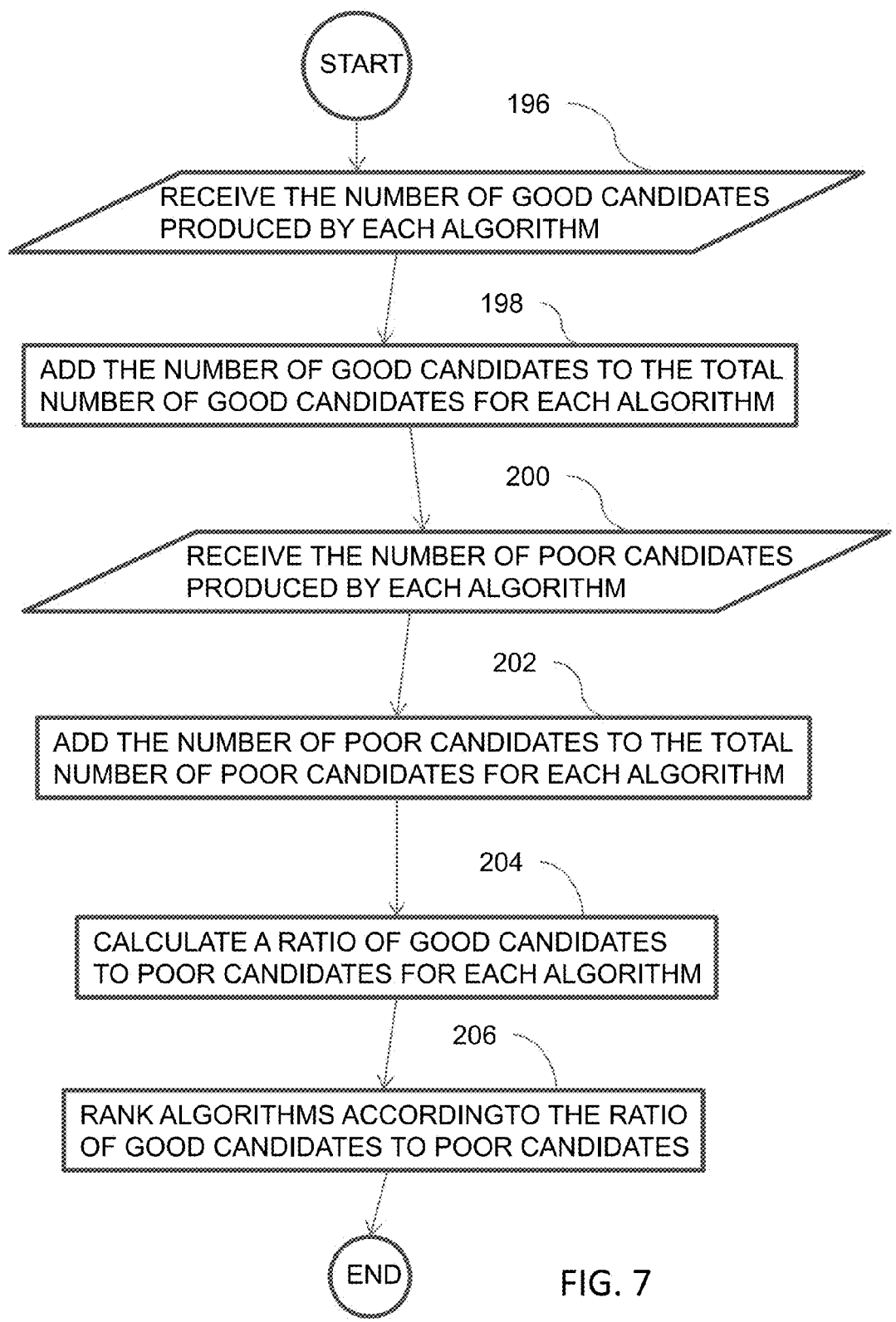
FIG. 7 depicts a flowchart showing the process of modifying the weight given to each of a group of algorithms depending on the number of good and poor candidates produced by each algorithm.

Another method of adjusting the weights given to each of the multiple algorithms used within a selection process is illustrated in FIG. 7. This method is based on the success of each algorithm in producing good candidates as compared to poor candidates. The number of good candidates produced by each algorithm is received at step 196. The number of good candidates for all searches by each algorithm is maintained, so the number of candidates collected at step 196 is added to this total at step 198. Similarly, the number of poor candidates produced by each algorithm in a given search is collected at 200. This number is added to the total number of poor candidates produced by each algorithm for all searches at step 202. The total numbers of good candidates and poor candidates for each algorithm is used to calculate a ratio of good candidates to poor candidates for each algorithm at step 204. Algorithms are then ranked according to the ratio of good candidates to poor candidates at step 206. The performance of each algorithm is therefore tracked over time, with data from each search contributing to the overall results. Those algorithms with the best ratios of good candidates to poor candidates can be given greater weight than those algorithms with lower ratios.

Figure 8:
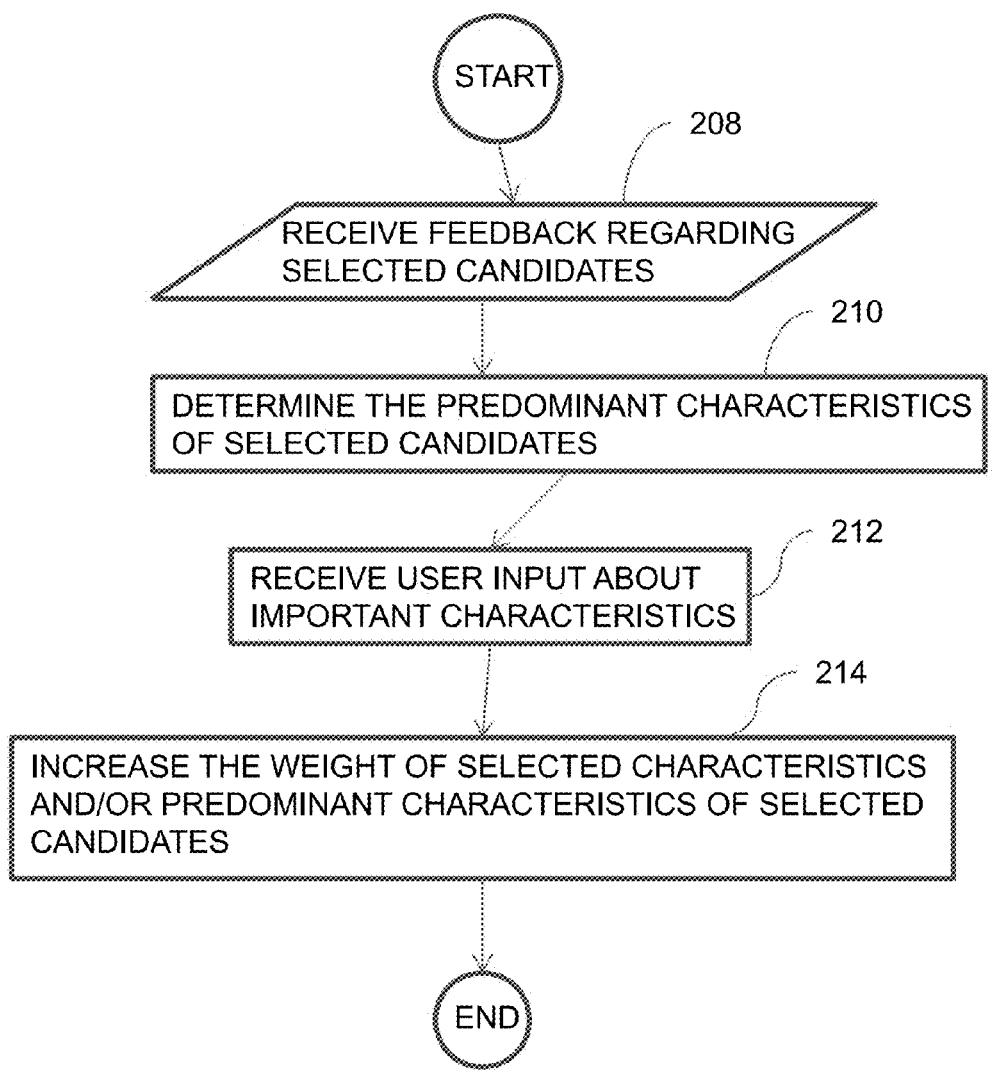
FIG. 8 depicts a flowchart showing the process of modifying algorithms by adjusting the weight given to various candidate characteristics based on the importance of those characteristics to the reviewer.

Yet another method of enhancing search algorithms is illustrated in FIG. 8. This method is intended to give greater weight to those characteristics of candidates that are particularly valued by a particular searcher. Feedback regarding selected candidates after a search is received at step 208. The predominant characteristics of selected candidates as determined at step 210. User input about important characteristics for that user is received at step 212. The information about user determines important characteristics, as well as the predominant characteristics of the selected candidates, is then used to increase the weight of the characteristics that appear to be most important to that specific searcher at step 214. It is anticipated that different individuals or entities may place greater or lower value on various candidate characteristics. As searchers continue to perform searches, the algorithm used by that searcher will become more tailored to the desires of that searcher.

Figure 9:
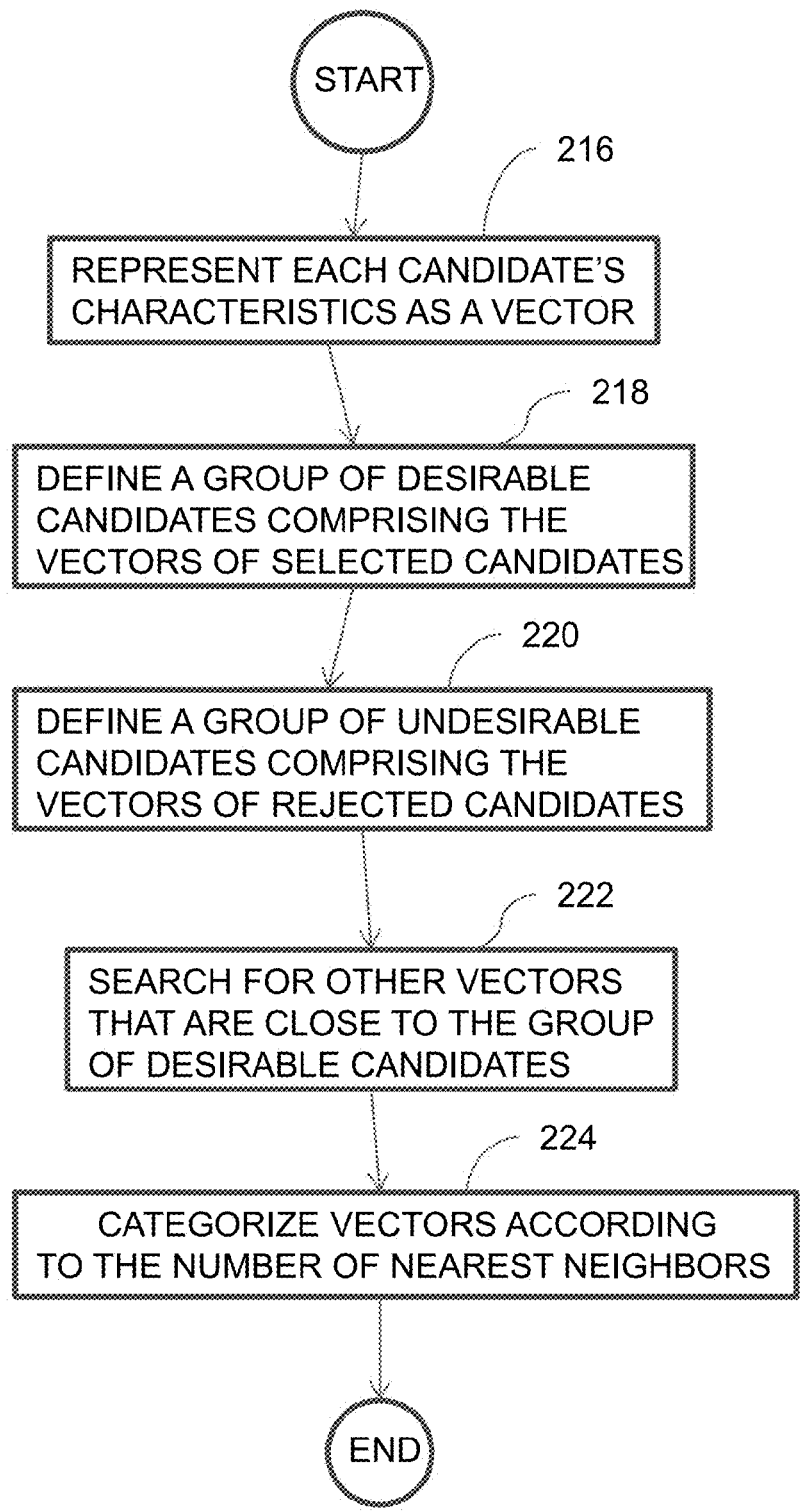
FIG. 9 depicts a flowchart showing the process of searching for additional candidates based on a nearest neighbor algorithm.

Once a search has been performed, one method of expanding the field of potential desirable candidates is by performing a nearest neighbor search, as illustrated in FIG. 9. In order to perform a nearest neighbor search, each candidate's characteristics must be expressed as a numerical value. The group of characteristic values for each candidate can then be expressed as a vector at step 216. The group of desirable candidates selected by the searcher can then be used to define a group of desirable candidates at step 218. Similarly, a group of undesirable candidates can be defined at step 220 utilizing the vectors of the rejected candidates. Other vectors that are close to the group of desirable candidates can be searched for and identified at step 222. The candidates found will then have their vectors categorized as either desirable candidates or undesirable candidates according to the number of nearest neighbors in each group at step 224. When suitable nearest neighbor algorithm is further explained by the Wikipedia article entitled *K-Nearest Neighbor Algorithm*, located at http://en.wikipedia.org/wiki/K-nearest_neighbor_algorithm, the entire disclosure of which is incorporated herein by reference.

Although modification of the search algorithms, and weight given to multiple algorithms, is explained from an employer perspective, the same principles apply for modification of the search algorithms and groups of algorithms utilized by job seekers.

The present invention therefore provides a system for matching candidates with personnel needs. The system begins with a detailed description of all candidate and personnel needs, in a manner that is intended to accurately portray a variety of attributes for both the candidate and the personnel need. As searches are performed by either candidate were personnel searcher, feedback is solicited from both parties. This feedback is utilized to modify the profiles of the candidate and the personnel need, as well as the algorithms utilized to perform the searching, and the weight given to these algorithms. Feedback from both parties is requested at various points in the screening process, as well as after a candidate is hired, so that the accuracy of both the profiles and the algorithms can be maximized. Repeat usage of the system results in increasingly customized profiles and algorithms for both the candidates and personnel searchers, thereby resulting in continuous refinement of the search process.

A variety of modifications to the above-described embodiments will be apparent to those skilled in the art from this disclosure. For example, the system could be used not only for employment, but also for matchmaking and dating services. Furthermore, other examples may allow the specific screening process to be selected and/or modified by the end user. Thus, the invention may be embodied in other specific forms without departing from the spirit or essential attributes thereof. The particular embodiments disclosed are meant to be illustrative only and not limiting as to the scope of the invention. The appended claims, rather than to the foregoing specification, should be referenced to indicate the scope of the invention.

What is claimed is:

1. A computer-implemented system for matching personnel with personnel seekers, comprising:
   a personnel seeker database structured to contain at least one personnel need, as well as at least one personnel need attribute associated with the at least one personnel need;
   a candidate database structured to contain at least one candidate, as well as at least one candidate attribute associated with the at least one candidate;
   utilizing at least one matching algorithm to produce a list of candidates having attributes that correspond to the attributes of the at least one personnel need;
   soliciting feedback regarding the candidates within the list of candidates;
   modifying the at least one matching algorithm, the at least one candidate attribute, or the at least one personnel need attribute based on the feedback; and
   producing a next list of candidates utilizing the modified at least one algorithm.

2. The system according to claim 1, wherein the at least one personnel need attribute is determined from the group consisting of required skills, personnel need characteristics, personnel seeker characteristics, and profiles of successful personnel who previously filled the personnel need.

3. The system according to claim 1, wherein the at least one personnel need attribute is determined utilizing input from multiple representatives of the personnel seeker.

4. The system according to claim 1, wherein the at least one candidate attribute is determined utilizing information selected from the group consisting of employment history, personality profile, education background, skills assessment, and personnel need preferences.

5. The system according to claim 1, wherein the at least one algorithm includes multiple algorithms.

6. The system according to claim 1, wherein an algorithm weight is assigned to each algorithm.

7. The system according to claim 6, wherein at least one algorithm weight is modified in response to feedback regarding the candidates.

8. The system according to claim 7, wherein the at least one algorithm weight is modified by identifying algorithms that produce a better ratio of good results to poor results than other algorithms.

9. The system according to claim 7, wherein the at least one algorithm weight is modified through the steps of:
   calculating a correlation coefficient between the algorithm inputs and results; and
   modifying the at least one algorithm weight until a maximum correlation coefficient is reached.

10. The system according to claim 1, further comprising a means for including a personnel seeker defined algorithm within the at least one algorithm.

11. The system according to claim 1, further comprising:
    utilizing at least one matching algorithm to produce a list of personnel needs having attributes that correspond to the attributes of the at least one candidate;
    soliciting feedback regarding the personnel needs within the list of personnel needs; and
    producing a next list of personnel needs utilizing the modified at least one algorithm.

12. The system according to claim 11, further comprising modifying the at least one matching algorithm based on the feedback.

13. The system according to claim 11, further comprising finding candidates that are nearest neighbors to a group of desired candidates.

14. The system according to claim 11, wherein the at least one personnel need attribute is determined from the group consisting of required skills, personnel need characteristics, personnel seeker characteristics, and profiles of successful personnel who previously filled the personnel need.

15. The system according to claim 11, wherein the at least one algorithm includes multiple algorithms.

16. The system according to claim 11, wherein an algorithm weight is assigned to each algorithm.

17. The system according to claim 16, wherein at least one algorithm weight is modified in response to feedback regarding the personnel needs.

18. The system according to claim 17, wherein the at least one algorithm weight is modified by identifying algorithms that produce a better ratio of good results to poor results than other algorithms.

19. The system according to claim 17, wherein the at least one algorithm weight is modified through the steps of:
    calculating a correlation coefficient between the algorithm inputs and results; and
    modifying the at least one algorithm weight until a maximum correlation coefficient is reached.

20. The system according to claim 11, further comprising a means for including a candidate defined algorithm within the at least one algorithm.

21. The system according to claim 1, further comprising permitting candidates to contact personnel seekers having personnel needs to which the candidates were not matched.

22. The system according to claim 21, further comprising modifying the at least one algorithm in the event that the personnel seeker likes a candidate who was not matched to a personnel need of the personnel seeker.

23. The system according to claim 1:
- wherein feedback is sought at multiple points in a candidate selection process or in a personnel need selection process; and
- wherein a revised list of candidates or personnel needs is provided in response to the feedback received at a given step.

* * * * *